(12) United States Patent
Salmi et al.

(10) Patent No.: US 6,784,751 B2
(45) Date of Patent: Aug. 31, 2004

(54) METHOD AND APPARATUS PROVIDING RESAMPLING FUNCTION IN A MODULUS PRESCALER OF A FREQUENCY SOURCE

(75) Inventors: Mika Salmi, Turku (FI); Mikael Svard, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/955,874

(22) Filed: Sep. 18, 2001

(65) Prior Publication Data

US 2003/0052740 A1 Mar. 20, 2003

(51) Int. Cl.[7] ................................................. H03L 7/00
(52) U.S. Cl. ........................................... 331/16; 377/47
(58) Field of Search .......................... 331/1 A, 16, 25; 377/47, 48, 110; 332/100, 101

(56) References Cited

U.S. PATENT DOCUMENTS

| | | | | |
|---|---|---|---|---|
| 4,573,023 A | * | 2/1986 | Cok et al. .................... | 331/1 A |
| 4,991,187 A | * | 2/1991 | Herold et al. ................. | 377/48 |
| 5,889,443 A | | 3/1999 | Jorgensen .................... | 332/100 |
| 5,991,605 A | | 11/1999 | Rapeli ......................... | 455/76 |
| 6,094,100 A | * | 7/2000 | Kamikubo et al. .......... | 331/1 A |
| 6,134,285 A | * | 10/2000 | Lo .............................. | 375/355 |
| 6,144,243 A | | 11/2000 | Vaisanen ...................... | 327/307 |
| 6,249,560 B1 | * | 6/2001 | Ichihara ....................... | 375/376 |
| 6,359,943 B1 | * | 3/2002 | Lo .............................. | 375/340 |
| 6,385,276 B1 | * | 5/2002 | Hunt et al. ................... | 377/47 |
| 6,411,669 B1 | * | 6/2002 | Kim ............................. | 377/48 |
| 6,583,674 B2 | * | 6/2003 | Melava et al. ................ | 331/16 |
| 6,633,185 B2 | * | 10/2003 | Starr ............................ | 327/157 |

* cited by examiner

*Primary Examiner*—Michael Tokar
*Assistant Examiner*—Linh V Nguyen
(74) *Attorney, Agent, or Firm*—Harrington & Smith, LLP

(57) ABSTRACT

A resampling technique is used to reduce the noise and improve the signal quality in the output of a prescaler circuit (10). The resampling of the output of a last frequency divider stage is accomplished using at least one flip/flop (FF) (e.g., a D-type FF 18) that is clocked by a signal obtained from the input of the prescaler. This reduces or eliminates the noise caused by edge jitter in the output of the prescaler, as well as the effect of spurious signals generated by the prescaler. These teachings can be used in integer N PLLs and in fractional N PLLs, as well as in single and programmable dual or multi-modulus prescalers. Using this technique the current consumption of the prescaler frequency dividers (12, 14, 16) need not be increased in an effort to reduce the prescaler noise, thereby conserving current in battery powered and other applications.

18 Claims, 3 Drawing Sheets

METHOD AND APPARATUS PROVIDING RESAMPLING FUNCTION IN A MODULUS PRESCALER OF A FREQUENCY SOURCE

TECHNICAL FIELD

These teachings relate generally to signal generation circuits, such as local oscillator (LO) circuits, and more particularly relate to integer N and fractional N phase locked loop (PLL) circuitry and to prescaler circuitry employed in PLLs.

BACKGROUND

In a PLL application the noise generated by a prescaler can be particularly troublesome. The prescaler is typically implemented as a chain of frequency divider circuits (e.g., flip/flops and/or counters) and functions to scale, i.e., prescale, an input clock signal to some desired frequency. The frequency-scaled signal may be used in the PLL closed loop path between a voltage controlled oscillator (VCO) and the input of a phase comparator. In these types of frequency divider chains the last divider(s) typical generate the predominant noise component. The noise arises primarily from the asynchronously running frequency dividers and from the resulting temporal ambiguity or jitter in the edges of the prescaler output signal. The presence of the jitter in the output signal of the prescaler is manifested as circuit noise in downstream circuitry. A component of the noise can also arise from spurious signals generated by the prescaler itself, such as when the prescaler modulus is changed when using a phase rotation or phase switching PLL topology. The modulus of the prescaler (e.g., modulus or mod N) specifies the ratio of the input frequency to the output frequency (e.g., a mod 64 prescaler divides the input signal by 64 to produce the output signal.) This is an example of an integer modulus prescaler. However, non-integer or fractional modulus prescalers may also be employed.

In an integrated circuit design one needs a certain signal level to overcome signals (noise) found in the substrate and generated elsewhere. In high speed emitter-coupled logic (ECL) designs, typically used for high frequency circuits, the logical levels are made very small (typically 200–500 mV), and are generated by currents passing through a resistor. If the signal swing is too small then there are basically two options available to the designer: (a) increase the current, or (b) increase the resistor value. However, an increased resistor value results in increased thermal noise from the resistance. Thus, for low noise applications it is preferable to use a higher current and smaller resistors.

In an effort to reduce the prescaler noise it has been known to increase the current to the last divider(s) in the frequency divider chain. However, this approach is less than optimum when the prescaler forms a part of a PLL that in turn is incorporated into a battery powered portable device like a mobile communicator or mobile station, such as a cellular telephone. For example, the PLL may form a part of a frequency synthesizer that provides a tunable frequency local oscillator signal to one of an Inphase/Quadrature (I/Q) demodulator in an RF receiver chain or an I/Q modulator in an RF transmitter chain. In some applications a common frequency synthesizer and PLL combination may provide a single tunable frequency to both the IQ demodulator and to the IQ modulator. In some applications the receiver chain may be a direct conversion type of receiver wherein the input (received) RF signal is downconverted directly to a base band signal.

In any of these embodiments it can be appreciated that it is desirable that the output of the frequency synthesizer be noise-free, or substantially noise free, and furthermore that the reduction in the noise be accomplished using as little operating (battery) power as is possible.

SUMMARY OF THE PREFERRED EMBODIMENTS

The foregoing and other problems are overcome, and other advantages are realized, in accordance with the presently preferred embodiments of these teachings.

In accordance with the teachings of this invention a resampling technique is used to reduce the noise and improve the signal quality in the output of the prescaler. The resampling of the output of, by example, a last frequency divider stage is accomplished using at least one flip/flop (FF) (e.g., a D-type FF) that is clocked by a signal obtained from the input of the prescaler. This reduces or eliminates the edge jitter, as well as the effect of spurious signals generated by the prescaler. These teachings can be used in integer N PLLs and in fractional N PLLs, as well as in single and programmable dual or multi-modulus prescalers.

An advantage of the use of these teachings is that the current consumption of the prescaler frequency dividers need not be increased in an effort to reduce the prescaler noise. It is assumed that the additional current consumption that is required by the use of the additional F/F or F/Fs does not exceed the amount of additional current that would need to be supplied to the prescaler in order to reduce the noise by an equivalent amount.

In one aspect this invention provides a phase locked loop having a phase comparator that generates an output signal that is used to drive a voltage controlled oscillator, and a modulus N prescaler circuit coupled to an output of the voltage controlled oscillator. The prescaler circuit has an input node for coupling to the voltage controlled oscillator for receiving an input signal having a characteristic frequency that is to be divided by N, an output node for outputting a frequency divided signal that is coupled to the phase comparator, and a plurality of divider stages coupled between the input node and the output node for dividing the input signal by N. The prescaler circuit further includes at least one resampling stage coupled to an output of at least one of the divider stages for receiving an output signal therefrom and for synchronizing edges of the output signal to edges of the input signal, thereby reducing the amount of temporal ambiguity in the occurrences of the edges of the output signal. The value of N may be programmable. The at least one resampling stage may be implemented using a D-type flip-flop that is clocked with the input signal.

Also disclosed is a method for reducing the power consumption in a frequency source of a mobile station. The method includes operating a phase locked loop as part of the frequency source to generate a signal having a desired frequency. The step of operating the phase locked loop includes a step of dividing a frequency of an output signal of a voltage controlled oscillator by a predetermined amount and resampling the frequency divided signal using the output signal of the voltage controlled oscillator to reduce jitter in the frequency divided signal, without increasing the current consumption of frequency divider circuits that comprise the phase locked loop. The step of resampling operates a modulus N prescaler circuit that is coupled to the output of the voltage controlled oscillator. The prescaler circuit has the input node for coupling to the output of the voltage controlled oscillator for receiving the input signal having the characteristic frequency to be divided by N, an output node for outputting the frequency divided signal that is coupled to the phase comparator of the phase locked loop, and a plurality of the frequency divider circuits coupled between the input node and the output node for dividing the input signal by N. The step of resampling is accomplished in a resampling stage coupled to an output of at least one of the frequency divider circuits for receiving an output signal therefrom and for synchronizing edges of the output signal to edges of the input signal, thereby reducing jitter in the output signal.

These teachings also provide a method for operating a phase locked loop as part of a frequency source to generate a signal having a desired frequency. The method includes operating a multi-modulus prescaler function of the phase locked loop to divide a frequency of an output signal of an oscillator by a predetermined amount, and resampling the frequency divided signal using the output signal of the oscillator to equalize a delay added in different modes of the multi-modulus prescaler function. Advantageously, the delay is equalized without increasing the current consumption of the frequency divider circuits that comprise the phase locked loop.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
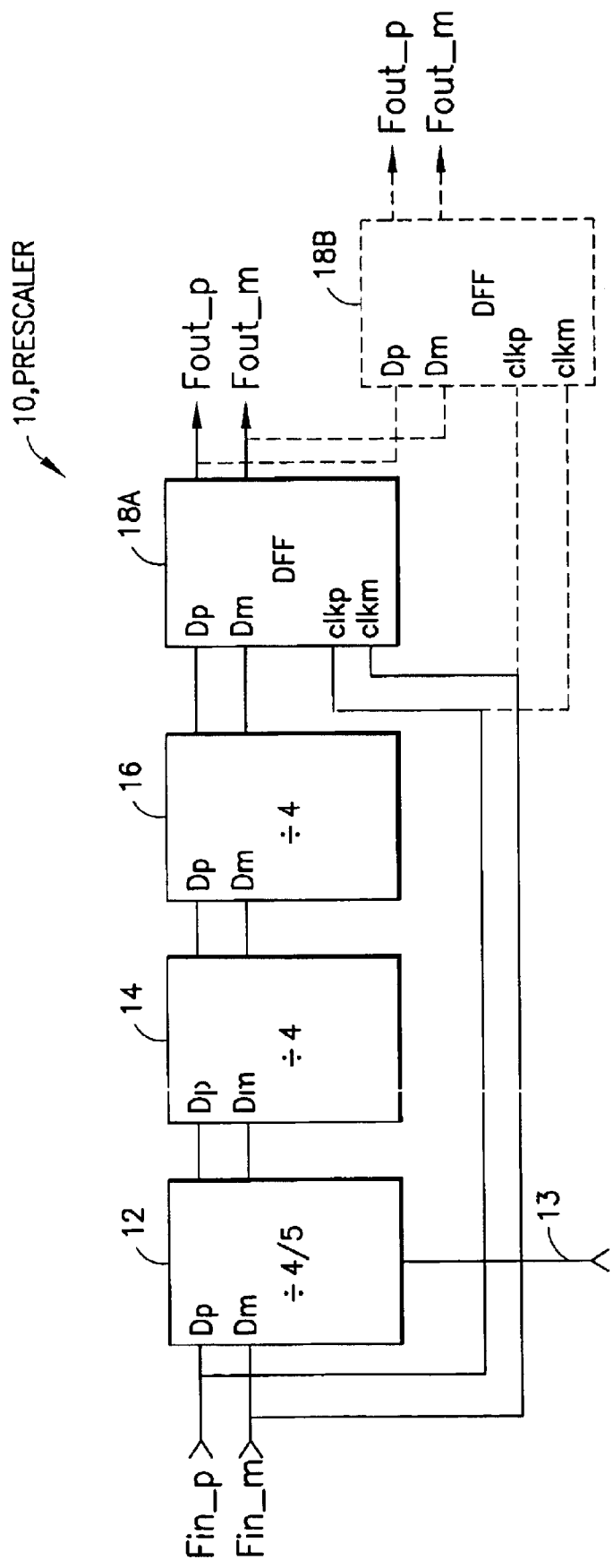
FIG. 1 is circuit diagram of a resampling prescaler in accordance with these teachings.

FIG. 1 shows a circuit diagram of a dual modulus (for example, a 64/65 modulus) prescaler 10 that is constructed and operated in accordance with these teachings. In this exemplary embodiment the prescaler 10 includes three frequency dividers, i.e., a controllable divide by 4 or divide by 5 first stage 12 (controlled by the state of a Modulus Control input signal 13), a fixed divide by 4 second stage 14 and a fixed divide by 4 third stage 16. These divider stages operate to divide the frequency of two input signals Fin_p and Fin_m by a total of either 64 or 65, depending on the state of the Modulus Control signal 13. The number of stages and the amount by which they divide the input signals is provided simply as an example, and other values may be selected.

In accordance with this invention the output signal from the third and final divider stage 16 is applied to the inputs of D-type F/F 18A, which is clocked by the higher frequency (by a factor of 64 or 65) input signals Fin_p and Fin_m. The result is that the output signals are resampled at the higher clock rate, and the edge transitions of the output signal are thus made synchronous with the edge transitions of the input signals. The result is that the indeterminancy in the locations (in time) of the edges of the output signals Fout_p and Fout_m from the D-type F/F 18A is reduced to an amount that corresponds to the inverse of the pulse-repetition-rate (PRR) of the input signals Fin_p and Fin_m, or in this case by a factor of either 64 or 65. If desired, a second (optional) D-type F/F 18B maybe provided to resample the edges of Fout_p and Fout_m.

It can be appreciated that this significant reduction in the output jitter of the output signal of the prescaler 10 is achieved without requiring that additional current be supplied to the final divider stage(s) of the prescaler 10.

Figure 2:
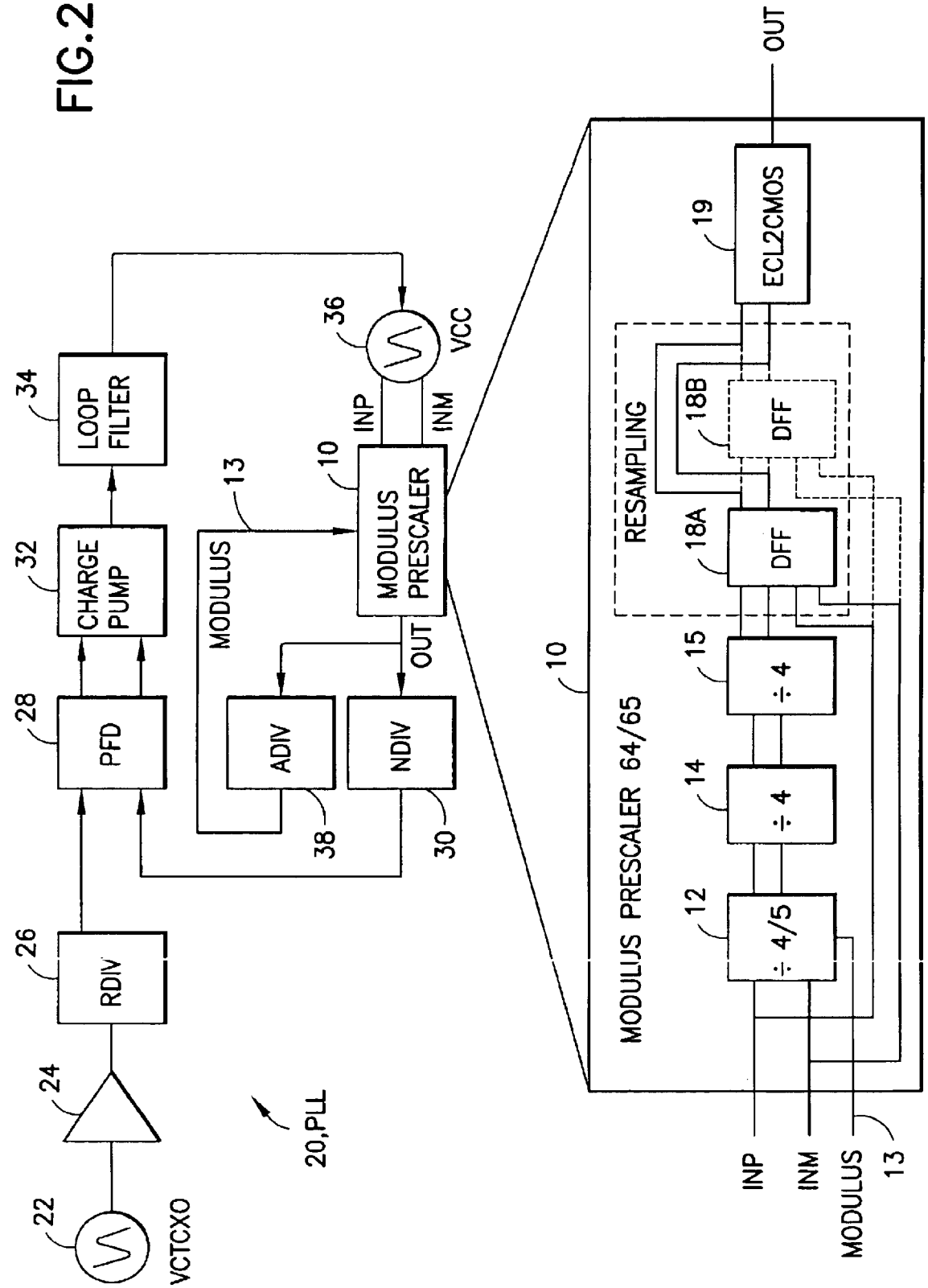
FIG. 2 is a block diagram showing the resampling prescaler of FIG. 1 in the context of a PLL circuit.

FIG. 2 is a block diagram showing the resampling prescaler 10 of FIG. 1 in the context of an exemplary PLL circuit 20. The PLL 20 includes or is driven by the output of a voltage controlled crystal oscillator (VCTCXO) 22 at some frequency, typically in the megahertz to gigahertz range, depending on the application. The VCTCXO output is buffered by buffer 24 and applied to a divider (RDIV) 26 where it is divided to some desired frequency. The divided signal is applied to a first input of a phase detector (PFD) block 28, where it is compared to a second signal arriving from a divide by N block 30. A phase difference between the edges generates a signal that is applied to a charge pump 32, which in turn drives a loop filter 34. The filtered output of the charge pump 32, an analog signal, is applied to a control input of a voltage controlled oscillator (VCO) 36. The output frequency of the VCO 36 is thus varied about some center frequency as a function of the phase relationship between the output of the VCTCXO 22 and the output of the VCO 36. In order to accomplish the phase comparison, the output of the VCO 36 is applied as the In_p and In_m signals to the inputs of the modulus prescaler 10 that was described in relation to FIG. 1.

Due to the high frequencies that are typically used it may be preferable to implement the dividers 12, 14 and 16 in emitter-coupled logic (ECL), as well as the D-type F/F(s) 18A, 18B. In this case an ECL to CMOS (ECL2CMOS) translator 19 is preferably provided at the output of the rescaler 10. The divided and resampled output of the prescaler 10 is applied to the divider block (NDIV) 30, which generates the second signal for comparison with the output of the RDIV block 26 by the PFD 28. The output of the prescaler 10 is also applied to another divider block (ADIV) 38 that operates to periodically change the state of the Modulus Control signal 13 to the first divider stage 12 of the prescaler 10.

Further with regard to FIG. 2, in a Fractional PLL the NDIV 30 and ADIV 38 will change after every output of the NDIV 30, at a frequency of the PFD 28 (e.g., at a rate of about 10–50 MHz).

Examples of the use of the ADIV 38 and the NDIV 30 are as follows.

TABLE

| $F_{ref}$ | times PRE/64 | (A)PRE AT/65 | (N)COUNTER div | Overall div | VCO freq |
|---|---|---|---|---|---|
| 0.2 MHz | 63 | 0 | 63 | 4032 | 806.4 MHz |
| 0.2 MHz | 62 | 1 | 63 | 4033 | 806.6 MHz |
| . | | | | | |
| . | | | | | |
| 0.2 MHz | 0 | 63 | 63 | 4095 | 819.0 MHz |
| 0.2 MHz | 64 | 0 | 64 | 4096 | 819.2 MHz |
| 0.2 MHz | 63 | 1 | 64 | 4097 | 819.4 MHz |
| . | | | | | |
| . | | | | | |
| 0.2 MHz | 26 | 63 | 89 | 5759 | 1151.8 MHz |

TABLE-continued

| $F_{ref}$ | times PRE/64 | (A)PRE AT/65 | (N)COUNTER div | Overall div | VCO freq |
|---|---|---|---|---|---|
| 0.2 MHz | 90 | 0 | 90 | 5760 | 1152.0 MHz |
| 0.2 MHz | 89 | 1 | 90 | 5761 | 1152.2 MHz |

An inspection of FIG. 2 shows why it is important that there be as little noise in the output of the prescaler 10 as is possible. This is true because the output of the prescaler 10 is eventually compared in the phase comparator 28 to the reference VCTCXO signal. If the prescaler output signal is noisy and experiencing jitter, then the input to the VCO 36 will be noisy as well, resulting in a PLL 20 that does not settle well to a desired operating frequency.

It should be appreciated that the overall construction of the PLL 20 shown in FIG. 2 maybe fairly conventional, with the exception of the improved prescaler 10 in accordance with the teachings of this invention, and is but one of a number of different types of PLLs that can use the improved prescaler 10 to advantage. That is, the specifics of the PLL 20 construction shown in FIG. 2 should not be viewed as a limitation upon the practice of these teachings.

Figure 3:
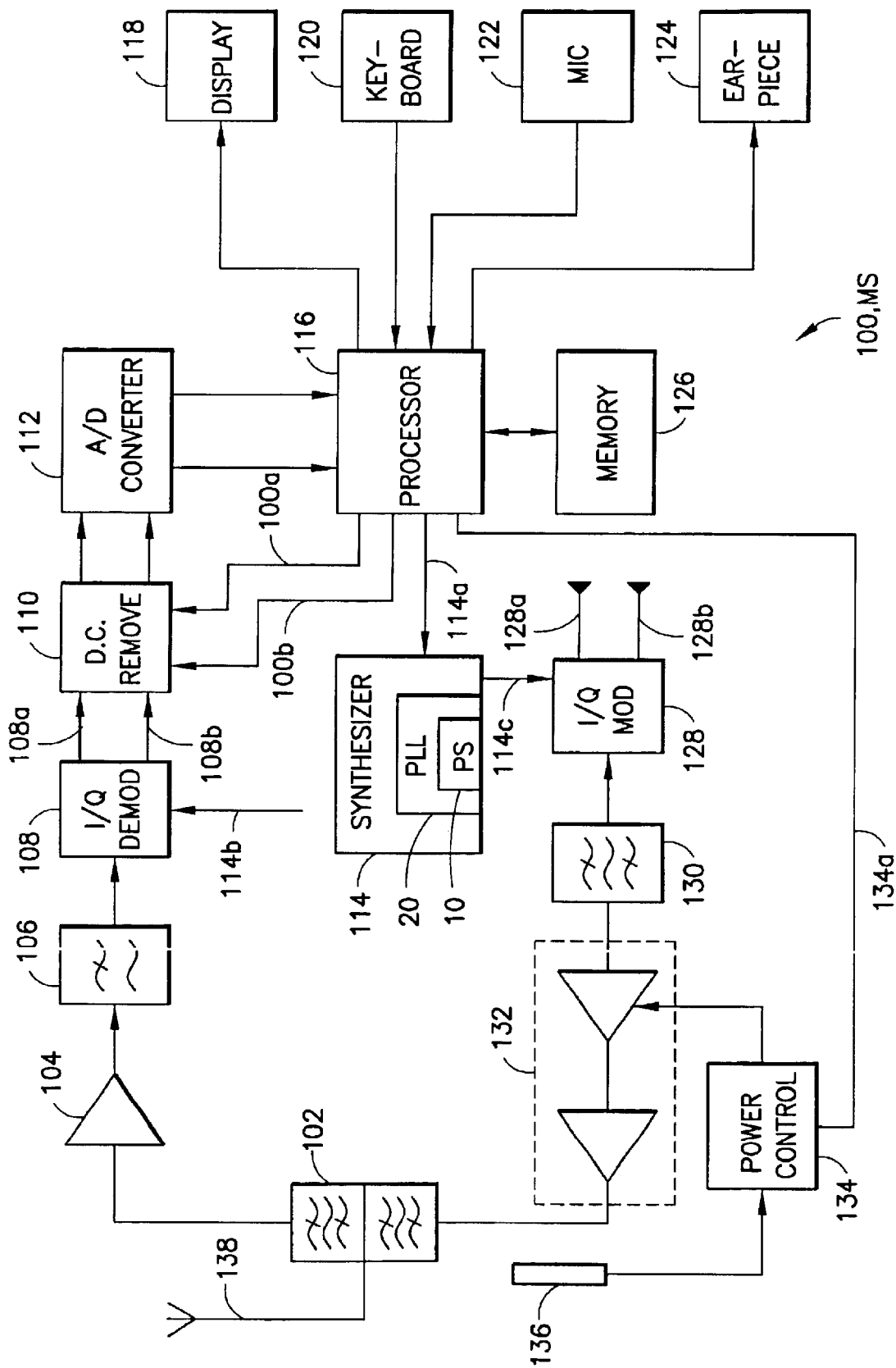
FIG. 3 shows the PLL circuit of FIG. 2 in the context of an exemplary mobile station architecture, in particular one having a direct conversion receiver.

Having shown the operation of the prescaler 10 in the context of the PLL 20, reference is now made to FIG. 3 for showing the PLL 20 in the context of a wireless communication terminal transceiver, such as a cellular telephone, also referred to herein for simplicity as a mobile station 100. More specifically, FIG. 3 is a block diagram of a transmitter-receiver (transceiver) of the mobile station 100, wherein the receiver is embodied as direct conversion receiver. An RF signal received by an antenna 138 is conducted via a duplex filter 102 to a preamplifier 104. The purpose of the duplex filter 102 is to permit the use of the same antenna both in transmitting and in receiving. Instead of the duplex filter 102, a synchronous antenna changeover switch could be used in a time-division system. An RF signal output from the preamplifier 104 is low-pass filtered 106 and demodulated in an I/Q demodulator 108 into an in-phase signal 108a and into a quadrature signal 108b. A local oscillator signal 114b, used for I/Q demodulation, is received from a synthesizer 114. The synthesizer 114 contains the PLL 20 as in FIG. 2, which in turn contains the improved prescaler 10 of FIG. 1. In block 110, the removal of a DC voltage component is carried out, as is automatic gain control (AGC). Block 110 is controlled by a processing block 116 that may contain, for example, a microprocessor. Automatic gain control is regulated by a signal 110a and removal of the offset voltage is regulated by a signal 110b. The analog signals output from block 110 are converted into digital signals in block 112, and from which the digital signals are transferred to digital signal processing circuits in the processing block 116.

The transmitter portion of the mobile station 100 includes an I/Q modulator 128 that forms a carrier frequency signal from an in-phase signal 128a and from a quadrature signal 128b. The I/Q modulator 128 receives a local oscillator signal 114c from the synthesizer 114. The generated carrier frequency signal is low-pass filtered and/or high-pass filtered by a filter 130 and is amplified by an RF amplifier 132. The amplified RF signal is transferred via the duplex filter 102 to the antenna 138. A transmitter power control unit 134 controls the amplification of the RF amplifier 132 on the basis of the measured output power 136 and in accordance with a control signal 134a received from the processor 116.

The processor 116 also controls the synthesizer 114 using a programming line or bus 114a, whereby the output frequency of the synthesizer 114 is controllably changed, as when tuning to different transmission and reception channels and/or to different frequency bands. Referring to FIG. 2, the state of the programming line 114a can be used to form a control input to the VCTCXO 22 whereby the frequency is set to a desired value for operating on a desired channel in a desired frequency band.

For completeness FIG. 3 also shows, connected to the processor 116, a memory unit 126 and a user interface having a display 118, a keyboard 120, a microphone 122 and an earpiece 124.

The specific mobile station 100 construction shown in FIG. 3 is exemplary, and is not to be construed in a limiting sense upon the practice of these teachings. For example, a superheterodyne type of RF architecture could be employed in other embodiments, as opposed to the direct conversion architecture depicted in FIG. 3.

Note should be made that the teachings of this invention apply as well to the use of resampling to overcome problems introduced by systematical signals generated by a phase rotation modulus prescaler (e.g., systematic signals that are ¼, 2/4 and ¾ of the modulus cycle time (i.e., phase comparison frequency.)

In general, the resampling function in accordance with these teachings removes signals generated in the multi-modulus prescaler structure, such as data having other than 64×Tinput+delay1 when performing modulus 65×Tinput+delay2. The resampling function forces the added delay to be equal in all cases.

While described above in the context of presently preferred embodiments, it should be appreciated by those skilled in the art that various modifications to these teachings maybe made, and that these modifications will also fall within the scope of this invention. For example, the synchronizing resampling technique can be used with different prescaler topologies such as phase rotation and pulse swallow prescaler topologies. The prescaler 10 circuitry could be ECL-based as shown in FIG. 2, or it could be, for example, CMOS-based. Furthermore, and while FIGS. 1 and 2 show the resampling circuitry 18 placed after the last divider stage 16, the resampling circuitry could be placed after any one of the divider stages (e.g., after the first divider stage 12, or after the second divider stage 14). In addition, one resampling stage (e.g., 18A) could be placed after the first or second frequency divider stage 12 or 14, and the second resampling stage 18B could be placed after a subsequent frequency divider stage, including the last frequency divider stage as shown in FIG. 1.

What is claimed is:

1. A phase locked loop comprising a phase comparator generating an output signal that is used to drive a voltage controlled oscillator, and a modulus N prescaler circuit coupled to an output of said voltage controlled oscillator, said prescaler circuit comprising an input node for coupling to said output of said voltage controlled oscillator for receiving an input signal having a characteristic frequency to be divided by N, said input signal comprising two clock input signals, an output node for outputting a frequency divided signal that is coupled to said phase comparator, and a plurality of divider stages coupled between the input node and the output node for dividing the input signal by N, and further comprising at least one resampling stage coupled to an output of at least one of said divider stages for receiving an output signal therefrom, said output signal comprising two output signals, and for synchronizing edges of the output signal to edges of the input signal, thereby reducing temporal ambiguity in the occurrence of the edges of the output signal, where said at least one resampling stage is comprised of a flip-flop having a data input coupled to said output of said at least one of said divider stages and a clock input coupled to said input node for being clocked with said output of said voltage controlled oscillator.

2. A phase locked loop as in claim 1, wherein the value of N is programmable.

3. A phase locked loop as in claim 1, wherein said flip-flop is comprised of a D-type flip-flop.

4. A method for reducing power consumption in a frequency source of a mobile station, comprising:

operating a phase locked loop as part of the frequency source to generate a signal having a desired frequency, the step of operating the phase locked loop including a step of dividing a frequency of an output signal of a voltage controlled oscillator by a predetermined amount to generate a frequency divided signal, the output signal of the voltage controlled oscillator comprising two output clock signal; and resampling the frequency divided signal using a flip-flop circuit that has a data input coupled to said frequency divided signal, the frequency divided signal comprising two frequency divided signals, and a clock input that is clocked with the output signal of the voltage controlled oscillator to reduce jitter in the frequency divided signal.

5. A method as in claim 4, wherein the step of resampling operates a modulus N prescaler circuit that is coupled to the output of the voltage controlled oscillator, the prescaler circuit comprising an input node for coupling to the output of the voltage controlled oscillator for receiving an input signal having a characteristic frequency to be divided by N, an output node for outputting a frequency divided signal that is coupled to a phase comparator of the phase locked loop, and a plurality of the frequency divider circuits coupled between the input node and the output node for dividing the input signal by N, where the step of resampling is accomplished in a resampling stage coupled to an output of at least one of the frequency divider circuits for receiving an output signal therefrom and for synchronizing edges of the output signal to edges of the input signal, thereby reducing jitter of the output signal.

6. A method as in claim 5, wherein the value of N is programmable.

7. A method as in claim 5, wherein the flip-flop circuit is comprised of a D-type flip-flop.

8. A method to operate a phase locked loop as part of a frequency source to generate a signal having a desired frequency, comprising:

operating a multi-modulus prescaler function of the phase locked loop to divide a frequency of an output signal of an oscillator by a predetermined amount to generate a frequency-divided signal, the output signal of the oscillator comprising two output clock signals; and resampling the frequency divided signal using a flip-flop circuit that has a data input coupled to the frequency divided signal and a clock input that is clocked with the output signal of oscillator, the frequency divided signal comprising two frequency divided signals.

9. A method as in claim 8, wherein the step of resampling operates a prescaler circuit that is coupled to the output of the oscillator, the prescaler circuit comprising an input node for coupling to the output of the oscillator for receiving an input signal having a characteristic frequency to be divided by N, the input signal being the output signal of the oscillator that comprises the two output clock signals, an output node for outputting the frequency divided signal that is coupled to a phase comparator of the phase locked loop, and a plurality of the frequency divider circuits coupled between the input node and the output node for dividing the input signal by N, where the step of resampling is accomplished in a resampling stage coupled to an output of at least one of the frequency divider circuits for receiving an output signal therefrom and for synchronizing edges of the output signal to edges of the input signal, thereby equalizing to delay added in different modes of the multi-modulus prescaler function.

10. A method as in claim 9, wherein the value of N is programmable.

11. A method as in claim 8, where said flip-flop is comprised of a D-type flip-flop that is clocked with the output signal of the oscillator.

12. A method as in claim 8, wherein the steps of operating and resampling are performed while a mobile station is tuned to a desired RF frequency band.

13. A method as in claim 8, wherein the output frequency of the oscillator is set in accordance with an output of a control device of a mobile station.

14. A mobile station, comprising a radio frequency (RF) transceiver that is tunable using a frequency synthesizer that comprises a phase lock loop (PLL), said PLL comprising a phase comparator for comparing a frequency divided oscillator output signal to a frequency divided voltage controlled oscillator (VCO) output signal and generating in accordance with said comparison a control signal that is applied via a loop filter to said VCO, further comprising a prescaler block disposed between an output of said VCO and an input of a frequency divider, said prescaler block comprising a frequency divider block having an input coupled to said output of said VCO, the output of the VCO comprising two output clock signals, said frequency divider block having an output for outputting a frequency divided signal, said prescaler block further comprising a flip-flop having an input coupled to said output of said frequency divider block and a clock input coupled to said output of said VCO, the output of said frequency divider block comprising two frequency divided output signals, said flip-flop operating to cause said prescaler block to output to said frequency divider a prescaled VCO signal having edge transitions that are synchronized to edge transitions of the VCO output signal.

15. A mobile station as in claim 14, where said prescaler comprises a multi-modulus prescaler.

16. A mobile station as in claim 14, where said prescaler comprises a phase rotation modulus prescaler.

17. A mobile station as in claim 14, where said RF transceiver comprises a direct conversion receiver.

18. A mobile station as in claim 14, where said PLL is used when at least one of tuning from one RF frequency channel to another, and tuning from one RF frequency band to another.

* * * * *